United States Patent
Mulder et al.

(10) Patent No.: US 12,407,360 B2
(45) Date of Patent: Sep. 2, 2025

(54) CIRCUIT AND METHOD FOR CALIBRATION OF A DIGITAL-TO-ANALOG CONVERTER

(71) Applicant: AVAGO TECHNOLOGIES INTERNATIONAL SALES PTE. LIMITED, Singapore (SG)

(72) Inventors: Jan Mulder, Houten (NL); Frank Van der Goes, Zeist (NL); Mohammadreza Mehrpoo, Eindhoven (NL); Sijia Wang, Utrecht (NL); Jeffrey Allan Riley, Utrecht (NL)

(73) Assignee: Avago Technologies International Sales Pte. Limited, Singapore (SG)

( * ) Notice: Subject to any disclaimer, the term of this patent is extended or adjusted under 35 U.S.C. 154(b) by 218 days.

(21) Appl. No.: 17/891,871

(22) Filed: Aug. 19, 2022

(65) Prior Publication Data

US 2024/0063809 A1  Feb. 22, 2024

(51) Int. Cl.
*H03M 1/10* (2006.01)

(52) U.S. Cl.
CPC .................. *H03M 1/1042* (2013.01)

(58) Field of Classification Search
CPC .................................... H03M 1/1042
USPC ......................... 341/120, 118, 155
See application file for complete search history.

(56) References Cited

U.S. PATENT DOCUMENTS 9,509,326 B1 * 11/2016 Kauffman ........... H03M 1/1009
11,271,576 B1 * 3/2022 Weil ................... H03M 1/1009

\* cited by examiner

*Primary Examiner* — Peguy Jean Pierre
(74) *Attorney, Agent, or Firm* — Foley & Lardner LLP

(57) ABSTRACT

A digital-to-analog converter (DAC) calibration system comprising: a DAC configured to convert digital input to an analog input, a detector configured to measure the analog outputs of the plurality of DAC unit cells and combine the analog outputs to create an overall analog output signal, and a calibration engine. The calibration engine is configured to calibrate the DAC.

20 Claims, 8 Drawing Sheets

CIRCUIT AND METHOD FOR CALIBRATION OF A DIGITAL-TO-ANALOG CONVERTER

FIELD OF THE DISCLOSURE

This disclosure generally relates to systems and methods for digital-to-analog conversion, and more particularly to calibration for a digital-to-analog converter.

BACKGROUND

A digital to analog converter is a circuit that can convert a first signal in a digital representation into a second signal in an analog representation. A signal can be one or more voltages, one or more currents, or any combination of them. A signal in an analog representation (or an analog signal) may indicate a value of data from a continuous range of values, where a signal in a digital representation (or a digital signal) may indicate a value of data from a finite set of values. An analog signal may provide a more accurate representation of data (e.g., audio data, image data, video data, or any data) than a digital signal, because a digital signal is obtained through quantization that involves truncating certain digits of the value. Meanwhile, an analog signal may be more susceptible to noise than a digital signal, and may not be suitable for processing or computation by an electronic device.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
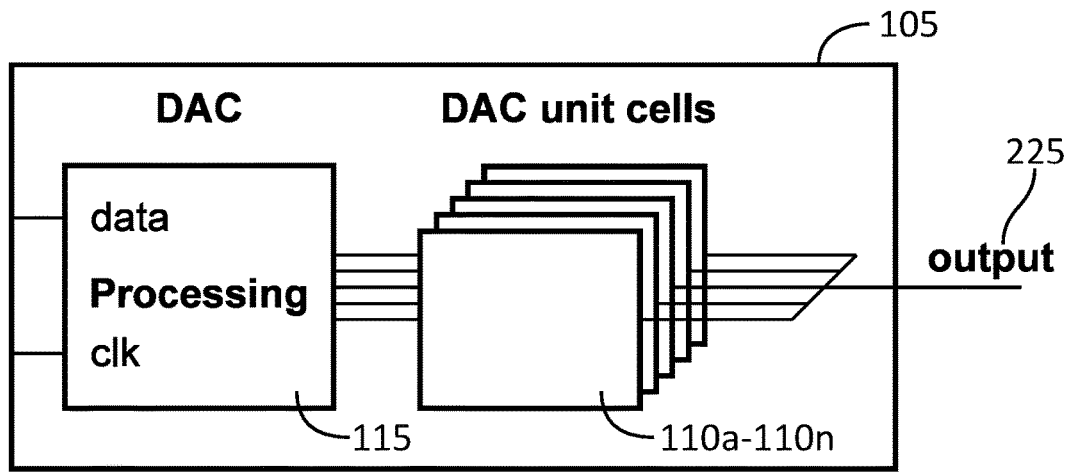
FIG. 1 is a schematic block diagram of a digital-to-analog converter (DAC), in accordance with an embodiment.
Figure 1:
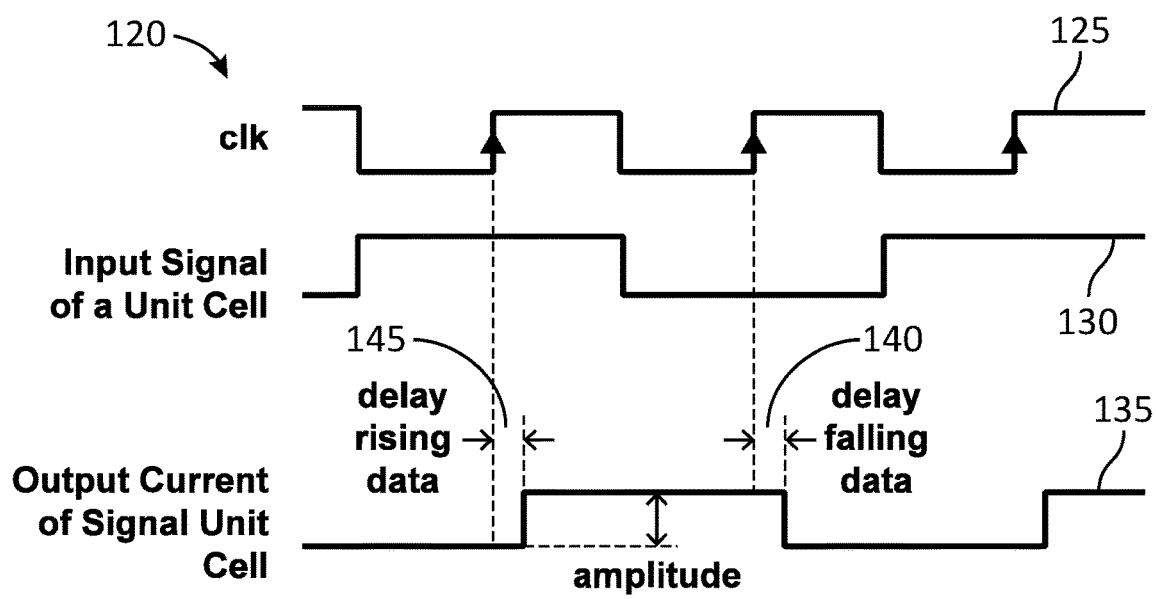

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Various embodiments disclosed herein are related to a digital-to-analog converter (DAC). In some embodiments, the DAC calibration system includes a DAC configured to convert digital input to an analog output. The DAC includes a processing circuit configured to provide the digital input for a number of DAC unit cells. The DAC unit cells are configured to receive the digital input from the processing circuit and convert the digital input to analog outputs. The DAC calibration system includes a detector configured to measure the analog outputs of the DAC unit cells and combine the analog outputs to create an overall analog output signal. The DAC calibration system includes a calibration engine including one or more processing circuits including one or more memory devices coupled to one or more processors, the one or more memory devices configured to store instructions thereon that, when executed by the one or more processors, cause the one or more processors to: designate one of the DAC unit cells as a reference cell with a first calibratable value, determine which DAC unit cell of the plurality of DAC unit cells has a lowest calibratable value, compare the first calibratable value with the lowest calibratable value, calibrate the first calibratable value to match the lowest calibratable value if the first calibratable value is higher than the lowest calibratable value, and calibrate the remainder of the DAC unit cells to match the calibrated first calibratable value. In some embodiments, a subset of DAC unit cells can be calibrated and the lowest value is the lowest value for that subset of DAC unit cells. The term calibrate means to adjust, change, check, or otherwise tune a value to provide a more accurate or more precise operation according to some embodiments.

In some embodiments, the digital input is at least one of a current signal and a voltage signal. In some embodiments, the digital input provided to a first DAC unit cell has an opposite sign to the digital input provided to a second DAC unit cell. In some embodiments, the processing circuit configured to provide a clock timing for the DAC. In some embodiments, combining the analog outputs to create the overall analog output signal comprises subtracting a second analog output from a first analog output. In some embodiments, the first calibratable value and the lowest calibratable value is at least one of an amplitude of the analog outputs and a timing of the analog outputs. In some embodiments, the DAC is a transmitter for wireless communication.

Various embodiments disclosed herein are related to a method. The method includes providing, by a processing circuit of the DAC, a digital input for a number of DAC unit cells, receiving, by the DAC unit cells, the digital input and converting the digital input to analog outputs, combining the analog outputs to create an overall analog output signal, designating one of the DAC unit cells as a reference cell with a first calibratable value, determining which DAC unit cell of the plurality of DAC unit cells has a lowest calibratable value, comparing the first calibratable value with the lowest calibratable value, calibrating the first calibratable value to match the lowest calibratable value if the first calibratable value is higher that the lowest calibratable value, and calibrating the remainder of the plurality of DAC unit cells to match the calibrated first calibratable value.

In some embodiments, the digital input is at least one of a current signal and a voltage signal. In some embodiments, the digital input provided to a first DAC unit cell has an opposite sign to the digital input provided to a second DAC unit cell. In some embodiments, the processing circuit configured to provide a clock timing for the DAC. In some embodiments, combining the analog outputs to create the overall analog output signal comprises subtracting a second analog output from a first analog output. In some embodiments, the first calibratable value and the lowest calibratable value is at least one of an amplitude of the analog outputs and a timing of the analog outputs. In other embodiments, the values may be calibratable based on a highest calibrated value. In this case, the first calibratable value and the highest calibratable value is at least one of an amplitude of the analog outputs and a timing of the analog outputs. In some embodiments, the DAC is a transmitter for wireless communication.

Various embodiments disclosed herein are related to a non-transitory computer-readable medium comprising one or more computer-executable instructions that, when executed by at least one processor of a computing device, cause the computing device to provide, by a processing circuit of the DAC, a digital input for a number of DAC unit cells, receive, by the DAC unit cells, the digital input and converting the digital input to analog outputs, combine the analog outputs to create an overall analog output signal, designate one of the DAC unit cells as a reference cell with a first calibratable value, determine which DAC unit cell of the DAC unit cells has a lowest calibratable value, compare the first calibratable value with the lowest calibratable value, calibrate the first calibratable value to match the lowest calibratable value if the first calibratable value is higher that the lowest calibratable value, and calibrate the remainder of the DAC unit cells to match.

In some embodiments, the digital input is at least one of a current signal and a voltage signal. In some embodiments, the digital input provided to a first DAC unit cell has an opposite sign to the digital input provided to a second DAC unit cell. In some embodiments, the processing circuit configured to provide a clock timing for the DAC. In some embodiments, the first calibratable value and the lowest calibratable value is at least one of an amplitude of the analog outputs and a timing of the analog outputs. In some embodiments, the DAC is a transmitter for wireless communication.

Disclosed herein are related to a DAC calibration system including a number of DAC cells. A cell herein refers to a unit circuit having a set of components in a particular arrangement. Each DAC cell may be configured to receive a corresponding one bit of multiple bits of data, and provide a current, voltage or power corresponding to the received one bit. In one aspect, currents from different DAC cells can be combined to represent the multiple bits of data. For example, an amplitude of the combined current in an analog representation may correspond to the multiple bits of data in a digital representation. In one aspect, calibration can be performed for each DAC cell to reduce errors in performing a digital-to-analog conversion.

In some embodiments, a DAC cell includes a bias control circuit, a driver circuit (or a latch), and a current steering circuit. The bias control circuit may be a circuit configured to provide one or more bias voltages for configuring the driver circuit and the current steering circuit. A bias voltage may be a voltage to set an amount of current flow or a drive strength (e.g., transconductance (gm)) of a transistor or a circuit. A drive strength may be an amount of change in a current provided, in response to a change in a voltage applied. The driver circuit may be a circuit configured to provide a second signal having a first edge, based on a first signal (e.g., bias voltages) from the bias control circuit. An edge of a signal may be a change in a state of the signal from one state to another state. A rising edge may be a change from a low state (e.g., 0V) to a high state (e.g., 1V), and a falling edge may be a change from a high state (e.g., 1V) to a low state (e.g., 0V). The first edge of the second signal may be set or adjusted, according to the drive strength of the driver circuit. For example, the second signal may have a faster edge by increasing the drive strength of the driver circuit. In one aspect, the driver circuit includes an adjustable current source that can set a drive strength, according to the first signal (e.g., bias voltages). In one aspect, the current steering circuit may be a circuit configured to generate or provide a current corresponding to one bit of data. The current steering circuit may be configured to generate a third signal having a second edge, in response to the first edge of the second signal.

In one aspect, the DAC is implemented for a wireless communication. For example, the DAC can be implemented in a transmitter for a radio frequency (RF) communication, such as a cellular communication (3G, 4G, 5G, 6G, etc.), Wi-Fi communication, Bluetooth communication etc. In some embodiments, the transmitter is a transmitter of a base station (e.g., eNode B (eNB), gNodeB (gNB), etc.) that provides a wireless communication. In one aspect, the DAC may operate at a high speed (e.g., over 5 Gbps), and may convert a modulated signal at radio frequency in a digital representation into an analog signal in an analog representation. The DAC may provide the analog signal to a preamplifier or a power amplifier for transmission through an antenna, such that an analog upconverter or an analog mixer can be omitted. By omitting the analog upconverter or the analog mixer, the transmitter can reduce power consumption, and can be implemented in a small form factor. Moreover, modulation or upconversion of a signal in a baseband frequency (e.g., 100 MHz~1 GHz) to a RF frequency (1~10 GHz) can be performed by a digital logic circuit that may be less susceptible to noise than an analog circuit, such that the transmitter can provide a signal with a higher signal integrity. Although the DAC disclosed herein is provided for a transmitter for a wireless communication, the DAC can be implemented for different applications. For example, the DAC disclosed herein can be implemented for a wired communication, an optical communication, or any computing device that performs digital-to-analog conversion (e.g., high speed digital-to-analog conversion).

In some embodiments, one or more components can be embodied as one or more transistors. The transistors implemented may be N-type transistors or P-type transistors. N-type transistor is a transistor that utilizes electrons as majority carrier. P-type transistor is a transistor that utilizes holes as majority carrier. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel. In one aspect, a transistor includes a source electrode, a drain electrode and a gate electrode. A source electrode and a drain electrode can be interchangeable, according to voltages applied to the source electrode and the drain electrode. Hence, a source electrode and a drain electrode can referred to as source/drain electrodes herein. According to a voltage applied to a gate electrode of the transistor, current may flow between a source electrode and a drain electrode. In certain application, a transistor can be implemented as a switch. For example, if a voltage difference between a gate electrode and a source electrode of a transistor is larger than a threshold voltage of the transistor, the transistor can be enabled to electrically couple between the source electrode and the drain electrode of the transistor. For example, if a voltage difference between a gate electrode and a source electrode of a transistor is less than a threshold voltage of the transistor, the transistor can be disabled to electrically decouple between the source electrode and the drain electrode of the transistor.

A DAC can include one or more DAC unit cells, a processing circuit, and an accurate reference or reference cell for calibrating the DAC unit cells. During use, each of the DAC unit cells may have difference between the amplitude, rising edge, and falling edge of a signal associated with the cell. Generally, high-performance DACs requires calibration of DAC unit cells so that all unit cells behave in an identical or a near identical way (e.g., same rising edge and falling edge timing, etc.). Calibration uses a reference value or reference cell. In some embodiments, the reference cell may be set to an accurate reference value. In some embodiments, systems and methods of calibration do not require extra circuitry inside each DAC unit cell to be able to detect the errors from that cell. In some embodiments, systems and methods of calibration avoids the negative impact on the high-frequency performance of the DAC caused by using separate signals paths to calibrate each of the DAC unit cells individually. Techniques that calibrate DAC cells individually are susceptible to situations where all the errors cannot be calibrated in the complete path. In some embodiments, systems and methods of calibration allow all errors to be calibrated in an efficient manner using the same output path.

Some embodiments of systems and methods described herein include a DAC calibration system in which all the DAC cells are compared to each other to measure the differences in the signals produced by each of the DAC unit cells within the DAC calibration system. In some embodiments, the DAC calibration system includes a detector which is configured to measure the output signal of each of the DAC unit cells and subtract the DAC unit cell output signals. Based the measurement of the output signals of the DAC unit cells, the DAC calibration system determines if there is a difference between output signals of the DAC unit cells and calibrates the DAC unit cells based on the determined difference. In some embodiments, the systems and methods do not require extra circuitry inside each DAC unit cell to detect differences between the unit cells.

In some embodiments, a digital-to-analog converter (DAC) includes DAC unit cells configured to receive a digital input from a processing circuit and convert the digital input to analog outputs, a detector, and a calibration engine. The calibration engine is configured to designate one of the DAC unit cells as a reference cell with a first value, and calibrate the first value of the reference to match a lowest or highest value of the DAC cells.

In some embodiments, a method for calibrating a DAC includes designating one of a number of DAC unit cells as a reference cell, adjusting the reference cell to have a first value at a first output, and comparing outputs of remaining DAC unit cells of the plurality of DAC unit cells with the first output. The method also includes adjusting the remaining DAC unit cells of the DAC unit cells to have the first value at the outputs.

In some embodiments, a calibration system is provided for a DAC. The DAC is configured to receive, by a number of DAC unit cells, a digital input and convert the digital input to analog signals, the analog signals being summed as an output signal. The calibration system includes a detector configured to determine an error between a first value of a first cell of the DAC unit cells to a reference value of a reference cell at a summed output associated with the output signal. The calibration system also includes a calibration engine configured to adjust the first cell to have the first value match the reference value in response to the error.

FIG. 1 illustrates a DAC 105 which is configured to convert a digital input to an analog input. The DAC 105 includes one or more DAC unit cells 110a-110n and a processing circuit 115. The processing circuit 115 is configured to receive and send data with each of the DAC unit cells 110a-110n and also run a clock which regulates the timing of each of the individual DAC unit cells. The DAC unit cells 110a-110n may each output a signal such as a current signal. DAC 105 can use systems and methods of calibration as described below according to some embodiments.

The DAC may operate to receive N-bit data in a digital representation, and provide signals in an analog representation corresponding to the N-bit data which was received. For example, the DAC unit cells 110a-110n may receive data from the processing circuit 115 in a digital format and then output the data in an analog format. In some embodiments, the output signal from the DAC unit cells may be in the form a current signal and/or a voltage signal.

In some embodiments, the waveform diagram 120 illustrates the signals which corresponds to a DAC unit cells 110a-110-n. For example, the waveform 125 is a signal illustrating a clock timing for the DAC. The waveform 130 is a signal at one of the inputs for the DAC unit cells 110a-110n. The waveform 135 is a signal at the output of the DAC unit cells 110a-110n. In some embodiments, the output signal may be a current signal. Waveform diagram 120 shows the waveform 135 is delayed (e.g., delayed rising data 145 and delayed falling data 140) which may indicate the DAC unit cell associated with the waveform 135 may need to be calibrated. Additionally, the waveform 135 has a higher amplitude which indicates that the DAC unit cell associated with the waveform may need to be calibrated. DAC 105 can include a detector that detects an error signal at a combined output of the DAC unit cells 110a-110n and a calibration engine that adjusts DAC unit cells 110a-110n in response to the error. A calibration engine is any type of circuit that performs calibration operations such as the calibration operations as described herein. In some embodiments, a unit cell can be a DAC unit cell or a repeating circuit used to provide an output signal that can be calibrated as described herein.

Figure 2:
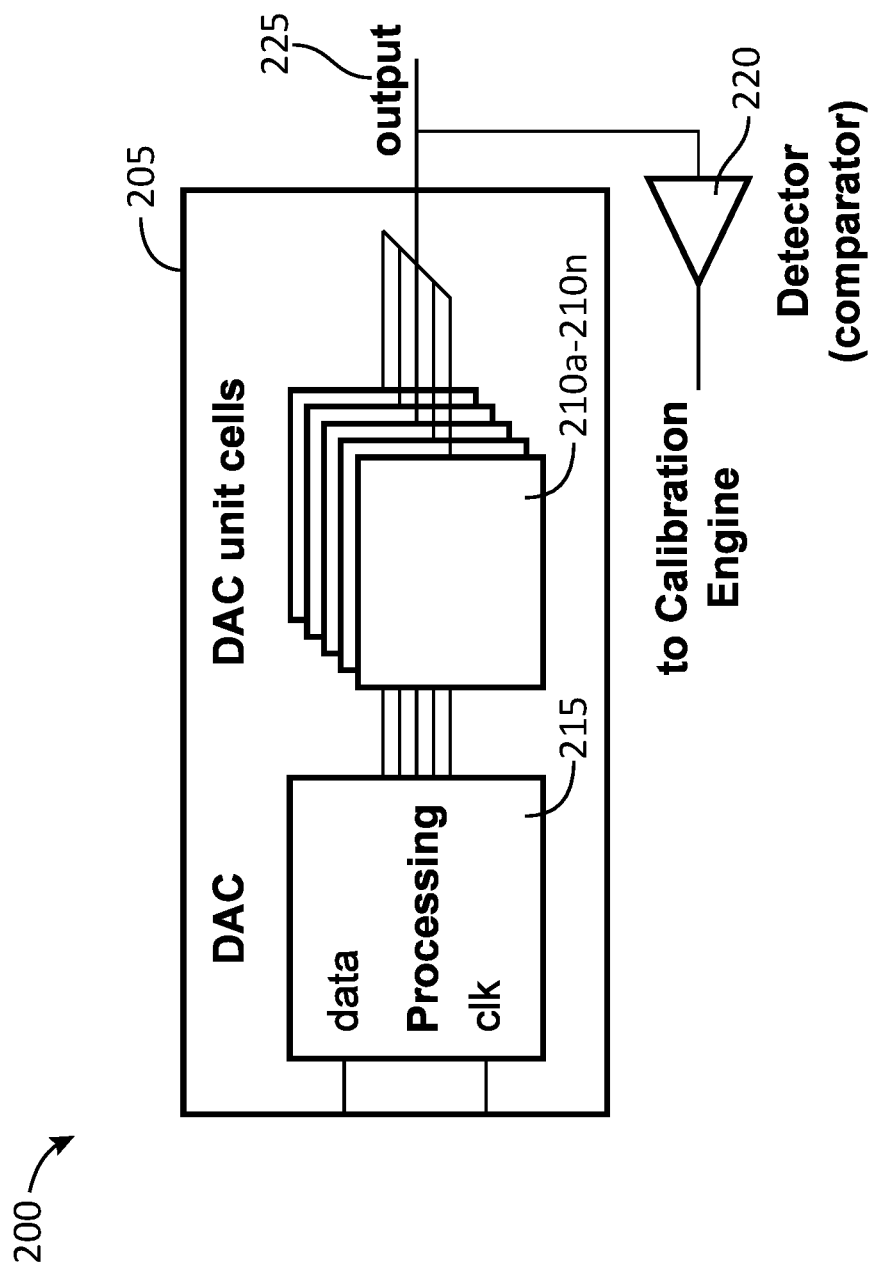
FIG. 2 a schematic block diagram of a DAC calibration system, in accordance with an embodiment.

FIG. 2 illustrates a DAC calibration system 200 which is configured to calibrate one or more DAC unit cells 210a-210n, in accordance with some embodiments. The DAC calibration system 200 includes a DAC 205 and a detector 220. The DAC 205 is configured to convert a digital signal to an analog signal. The DAC 205 includes one or more DAC unit cells 210a-210n and a processing circuit 215. The processing circuit 215 is configured to receive and send data with each of the DAC unit cells 210a-210n and also receives a clock signal which regulates the timing of each of the individual DAC unit cells 210a-210n. The DAC unit cells 210a-210n may each output a signal such as a current signal.

The DAC 205 may operate to receive N-bit data in a digital representation, and provide signals in an analog representation corresponding to the N-bit data which was received. N is any integer (e.g., 2, 3, 4, 7, 8, 15, 16, etc.). For example, the DAC unit cells 210a-210n may receive data from the processing circuit 215 in a digital format and then output a signal corresponding to the data in an analog format. In some embodiments, the output signal from the DAC unit cells may be in the form a current signal and/or a voltage signal.

Each of the DAC unit cells 210a-210n are configured to produce an output signal which is summed to provide an analog output signal as output signal 225. To calibrate the DAC unit cells 210a-210n, each output signal from each DAC unit cells 210a-210n can be compared to a different cell to determine a difference between the signals produced by each of the DAC unit cells 210a-210n. The detector 220 is connected to the DAC unit cells 210a-210n and is configured to measure the difference between the output signals of the DAC unit cells 210a-210n. The detector 220 determines the difference (e.g., error) by comparing (e.g., subtracting) the output signals of two DAC unit cells from each other. In some embodiments, the detector 220 is an amplitude comparator configured to compare the magnitude of the output signals or a comparator/timing circuit configured to compare circuit delays. Latches, subtractors, and other circuitry can be used to make the comparison in some embodiments. In some embodiments, the DAC unit cells 210a-210n use a fixed connection to the DAC output (the summed output) for the output signal 225. Two selected DAC unit cells of DAC unit cells 210a-210n are selected and summed. Two selected DAC unit cells 210a-n can be selected by providing digital data to only those two cells and providing no data (a ground signal to the other DAC unit cells) or otherwise turning off or preventing contribution from the other DAC unit cells at the summed output. In some embodiments, the two selected cells are provided data with the opposite sign (inverted data) from each other and are summed (e.g., to achieve subtracted signals as output signal 225). The detector 220 receives the output signals from the selected unit cells for comparison (e.g., analog signals that have been subtracted from each other). Detector 220 can compare the difference to a threshold to indicate a timing error or an amplitude error in some embodiments. Detector 220 can process or filter the difference to indicate the timing error or the amplitude error in some embodiments.

Figure 3:
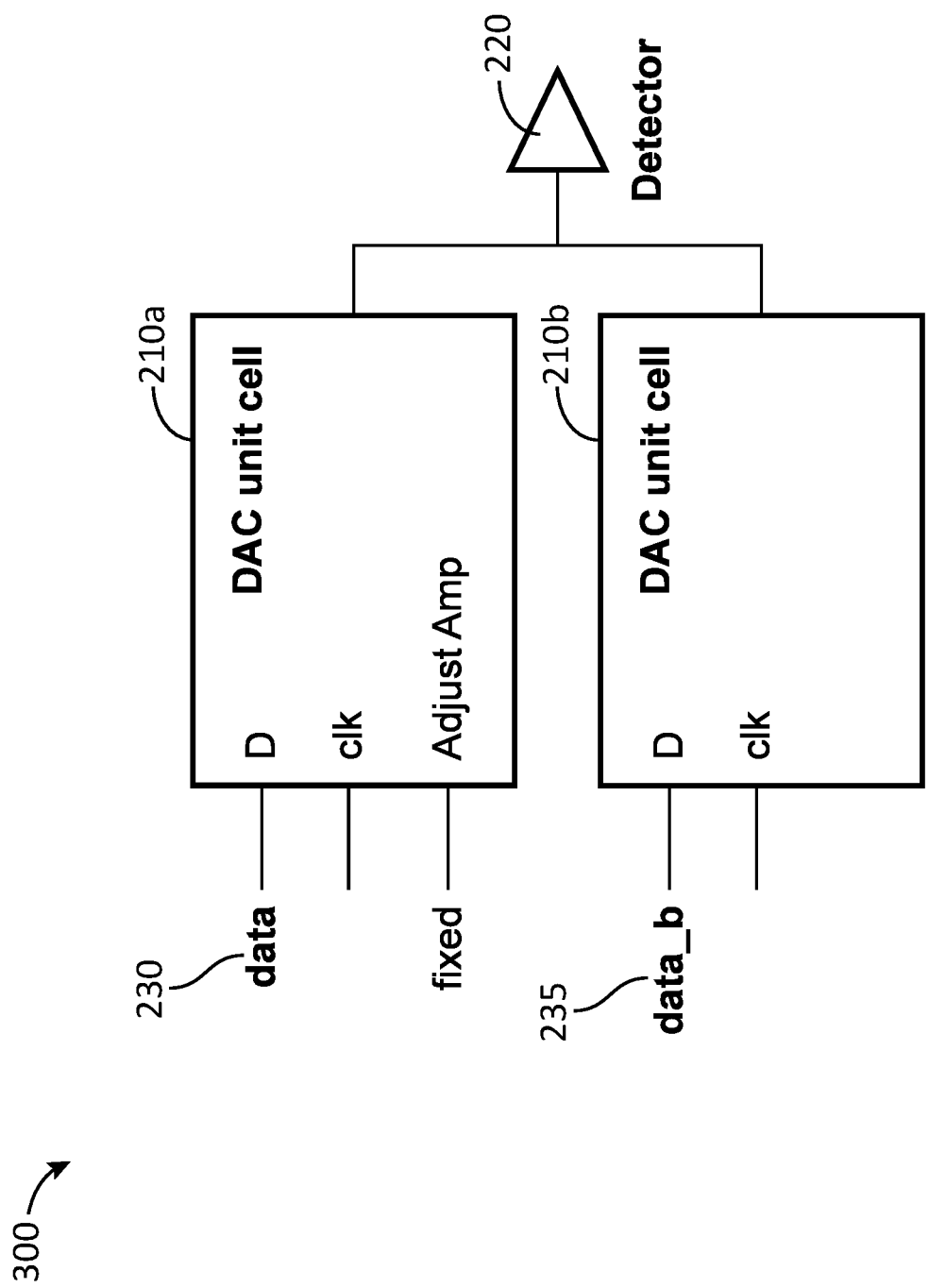
FIG. 3 a schematic block diagram of a comparison system for the DAC calibration system illustrated in FIG. 2, in accordance with an embodiment.

For example, FIG. 3 illustrates a comparison system 300 in which the output signal of two DAC unit cells 210a and 210b are being compared by the detector 220. In some embodiments, the DAC unit cell 210a receives a positive signal "data" as an input while DAC unit cell 210b receives a negative signal "data_b". Therefore, the output signal produced by the DAC unit cell 210a will be positive and the output signal produced by the DAC unit cell 210b will be negative. The negative signal is an inverted signal of the positive signal in some embodiments. In some embodiments, the data signal is a differential signal and the negative signal is a reversed differential signal. A variety of circuits can be used to provide a positive signal and a negative signal or invert the data signal.

Figure 4:
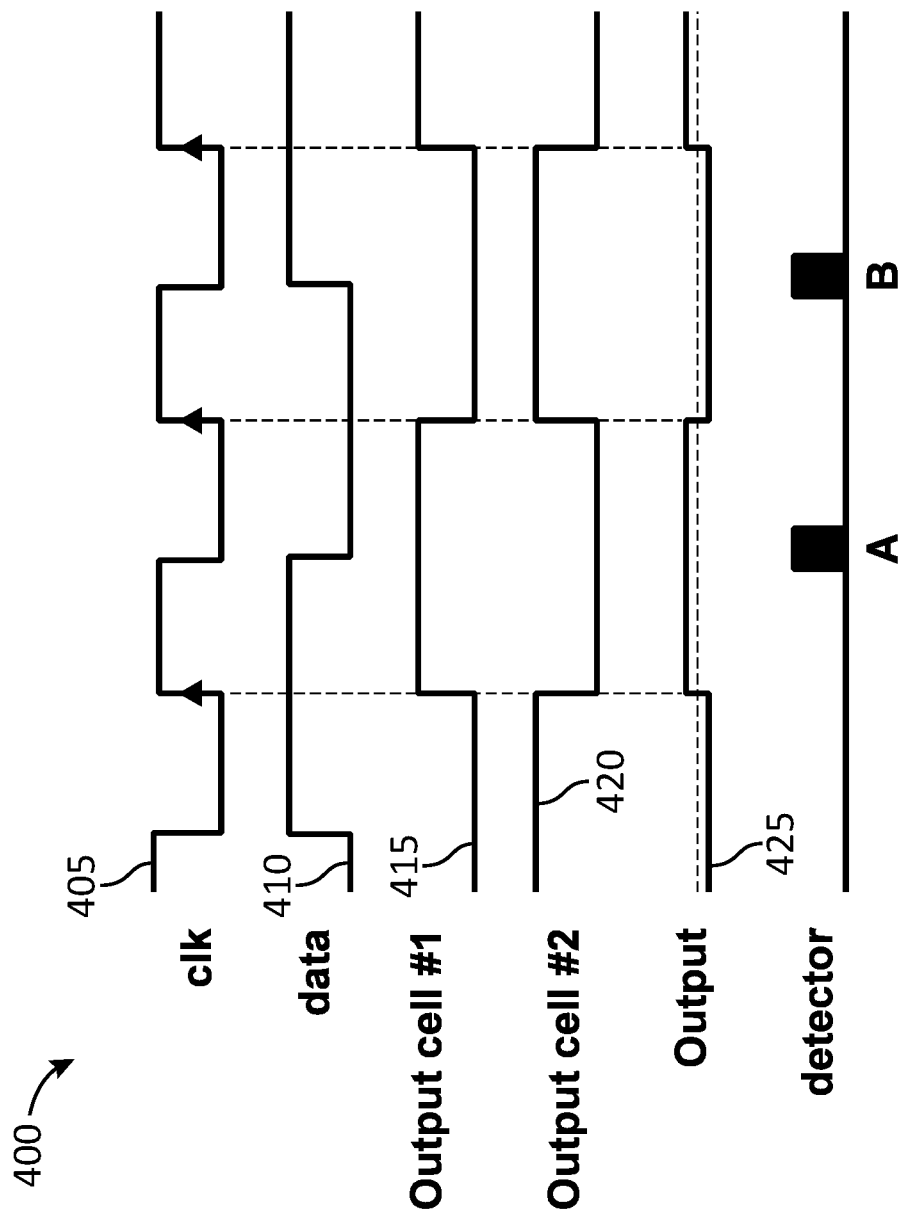
FIG. 4 is a first waveform diagram of the DAC calibration system of FIG. 2, in accordance with an embodiment.

FIG. 4 illustrates a waveform diagram 400 which demonstrates the comparison done by the detector 220 between the DAC unit cells 210a and DAC unit cells 210b as shown in FIG. 3. Waveform diagram 400 includes a clock signal 405 which is a signal illustrating a clock timing for the DAC 205. Waveform diagram 400 also includes a data signal 410 which is a signal illustrating the data received by the DAC unit cell 210a. The DAC unit cell 210b receives the opposite signal to data signal 410 in some embodiments. Waveform diagram 400 also includes an output signal 415 which is a signal illustrating the output of the DAC unit cell 210a. Waveform diagram 400 also includes an output signal 420 which is a signal illustrating the output of the DAC unit cell 210b. Output signal 420 is summed with output signal 415 to create one overall output signal 425. As can be seen in the overall output signal 425, there is an amplitude difference between output signal 415 and the output signal 420. This indicates that the DAC unit cell 210a and DAC unit cell 210b are not producing the same amplitude (e.g., have amplitude error with respect to each other). DAC unit cells 210a and 210b are calibrated to produce output signals with the same amplitude in some embodiments. Detector 220 provides a control signal 427 to the calibration engine representing the error associated with output signal 425. A method for calibrating the amplitude of the DAC unit cells 210a-210n is described in more detail below with respect to FIG. 7 according to some embodiments.

Figure 5:
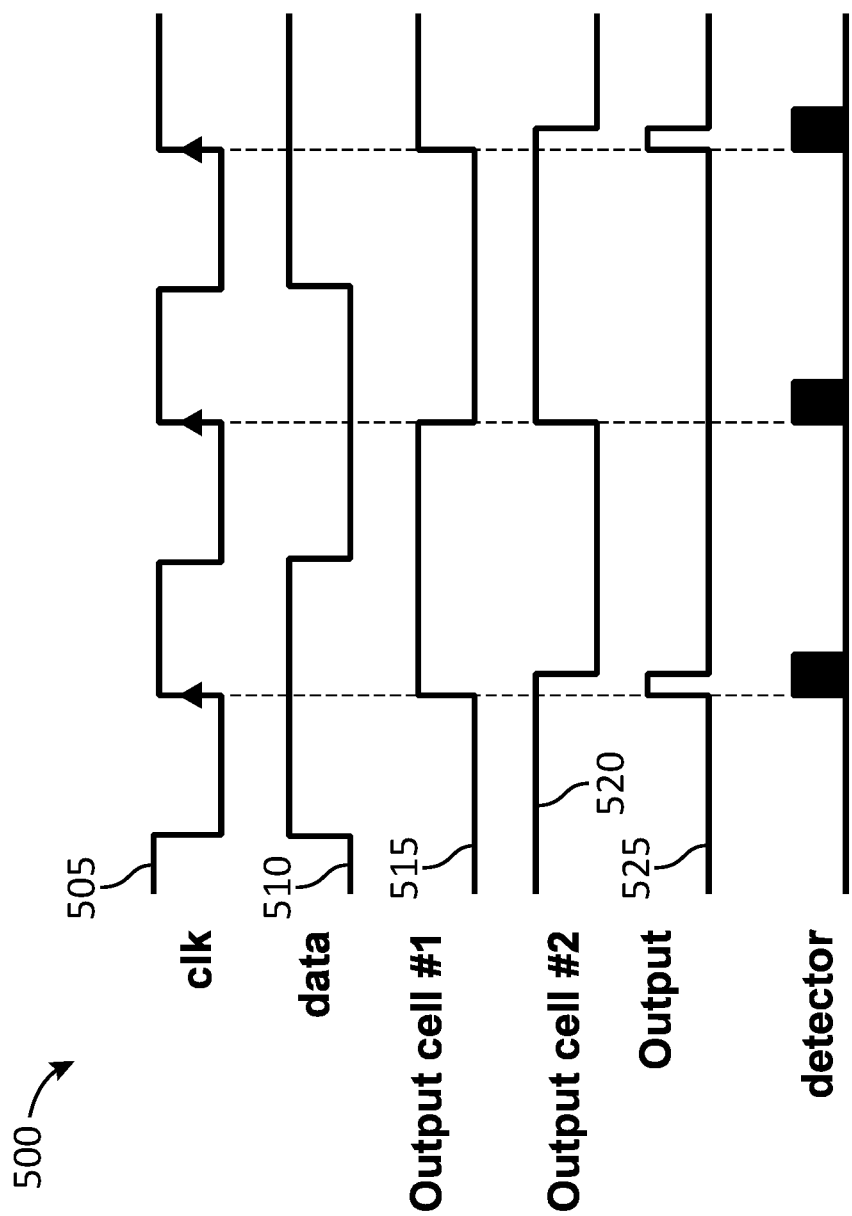
FIG. 5 is a second waveform diagram of the DAC calibration system of FIG. 2, in accordance with an embodiment.

FIG. 5 illustrates waveform diagram 500 which demonstrates the comparison done by the detector 220 between the DAC unit cells 210a and DAC unit cells 210b as shown in FIG. 3. Waveform diagram 500 includes a clock signal 505 which is a signal representing clock timing for the DAC 205. Waveform diagram 500 also includes a data signal 510 which is the data received by the DAC unit cell 210a and the DAC unit cell 210b. Waveform diagram 500 also includes an output signal 515 which is a signal at the output of the DAC unit cell 210a. Waveform diagram 500 also includes an output signal 520 which is the output of the DAC unit cell 210b. Output signal 520 may be summed with output signal 515 to create one overall output signal 525. As can be seen in the overall output signal 525, there is a delay between the rising edge of output signal 515 and the falling edge of output signal 520. This indicates that the DAC unit cell 210a and DAC unit cell 210b are not calibrated to produce output signals with the same timing schedule and need to be calibrated. Detector 220 provides a control signal 527 to the calibration engine representing the error or difference associated with output signal 525. The method for calibrating the timing of the DAC unit cells 210a-210n is described in more detail below with respect to FIG. 8 according to some embodiments.

Figure 6:
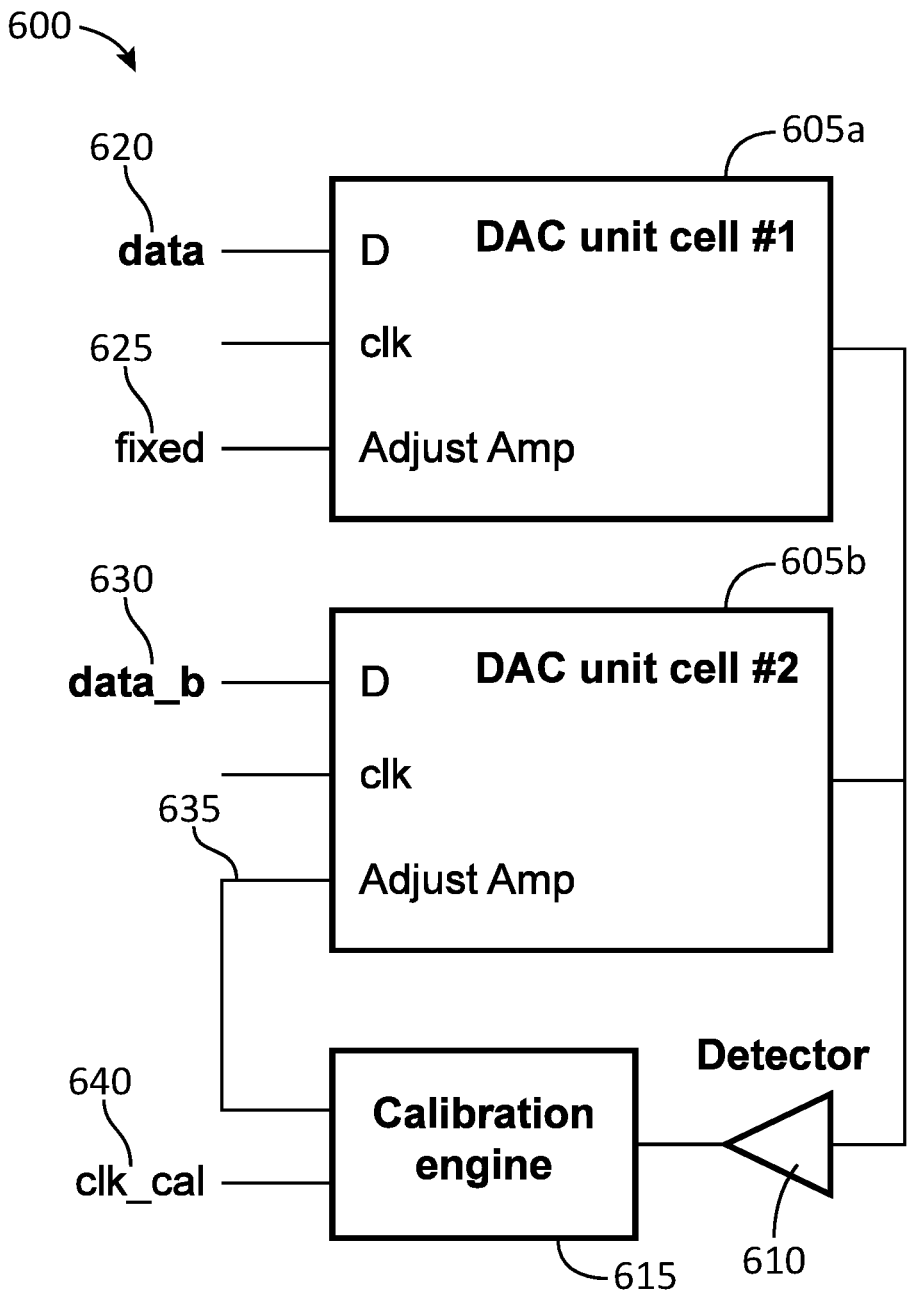
FIG. 6 is a schematic block diagram of a calibration engine coupled to the comparison system illustrated in FIG. 3, in accordance with an embodiment.

FIG. 6 illustrates a comparison and calibration system 600 which is configured to compare the output signals of two DAC unit cells and calibrate at least one of the DAC unit cells based on the comparison of the output signals. The comparison and calibration system 600 includes a first DAC unit cell 605a and a second DAC unit cell 605b. The first DAC unit cell 605a is configured to receive a positive data signal while the second DAC unit cell 605b is configured to receive a negative data signal. Each of the DAC unit cells 605a and 605b also receives a clock signal to regulate the timing of the DAC unit cell. Each of the DAC unit cells 605a and 605b also include a calibration input (input 625 and input 635). In some embodiments, the calibration input may be fixed if the DAC unit cell is a reference cell. A reference cell may be defined as the DAC unit cell which is used as a reference to calibrate other cells within the DAC. For example, in FIG. 6, the DAC unit cell 605a may be the reference cell thus having a fixed calibration input 625. In some embodiments, the calibration input 625 may be variable and dynamic based on the input received from the calibration engine 615. For example, the DAC unit cell 605b includes calibration input 635 for adjusting the amplitude of the output signal produced by the DAC unit cell 605b.

The calibration engine 615 may be configured to receive an input from the detector 610 (similar to the detector 220 described in more detail above) and determine a calibration output signal 635 for one or more DAC unit cells based on the input. The amplitude of the output signal produced by the DAC unit cell may continue to be adjusted based on the calibration output signal 635 produced by the calibration engine 615 until the error signal from detector 610 is reduced to an acceptable range in some embodiments. After calibration by the calibration engine 615, the DAC unit cell 605a and the DAC unit cell 605b to have the same amplitude and/or timing. The calibration output signal can adjust amplitude and timing. In some embodiments, the calibration output signal adjusts the gain of the second DAC unit cell 605b to adjust amplitude or timing.

Examples of adjustments of DAC unit cells 605a and 605b include a configuration to adjust a drive strength for generating or providing the current and/or a configuration to adjust an amplitude of the current 328. The calibrator 350 may determine a target configuration or a target setting of each DAC unit cells 605a and 605b, and provide a configuration signal indicating the determined configuration or setting to each DAC unit cell 605a and 605b. For example, if the calibration engine 615 determines, based on one or more feedback signals (e.g., from detector 610), that DAC unit cell 605a is faster than DAC unit cell 605b, the calibration engine 615 may generate a configuration signal causing the DAC unit cell 605a to decrease a drive strength to provide the current more slowly. For example, if the calibrator 350 determines, based on one or more feedback signals, that DAC unit cell 605a provides a current with an amplitude larger than amplitude of current provided by DAC unit cell 605b, the calibration engine 615 may generate a configuration signal (by adjusting gain or drive strength) causing the DAC unit cell 605a to provide the current 328 with a lower amplitude. In some examples, bias values, transconductance and current steering in the DAC unit cells 605a and 605b can be adjusted to calibrate the DAC unit cells for appropriate amplitude and timing.

Figure 7:
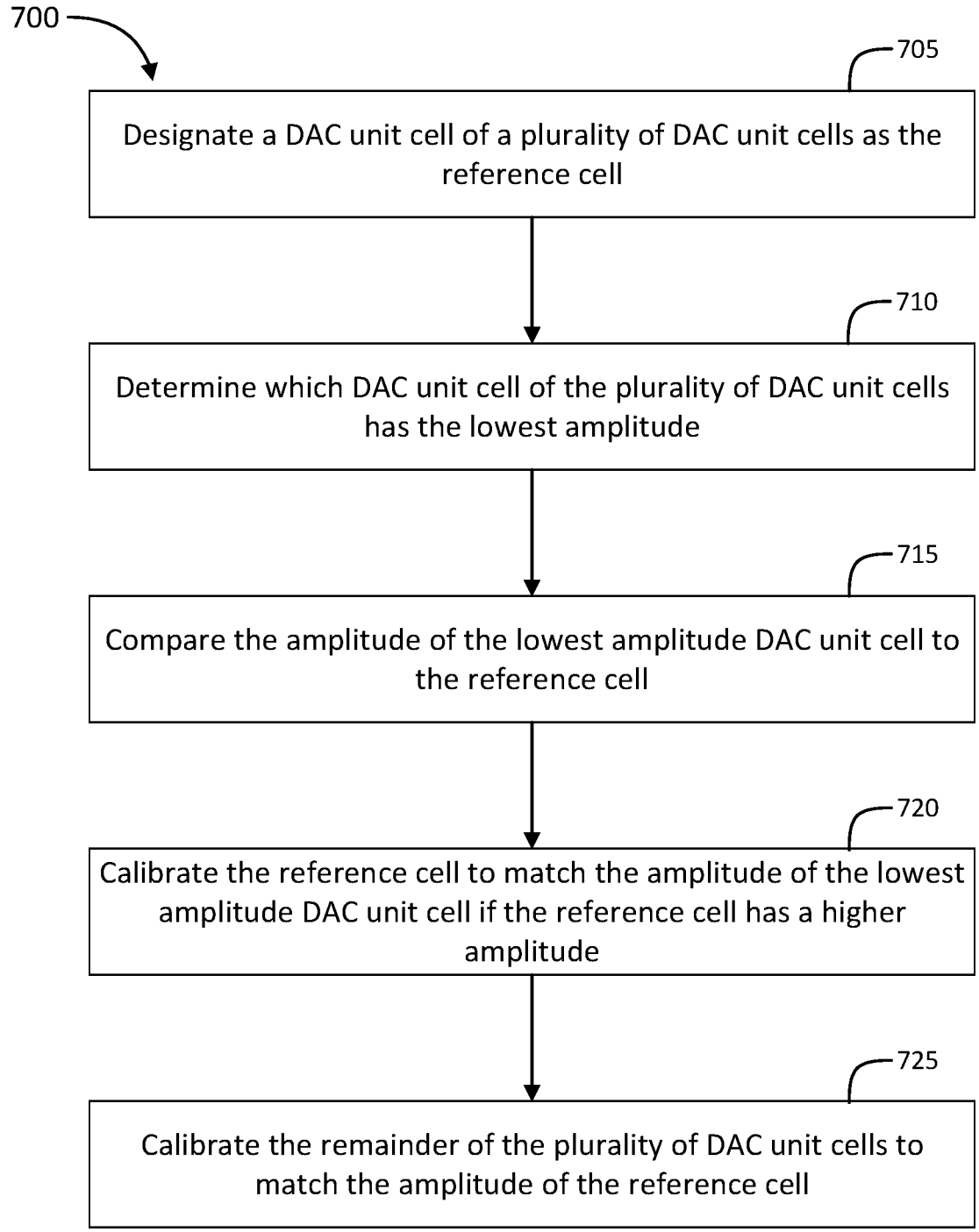
FIG. 7 is a flow diagram showing operations for calibrating the amplitude of one or more DAC unit cells, in accordance with an embodiment.

FIG. 7 is a flow diagram depicting a process 700 for calibrating the amplitude of one or more DAC unit cells, in accordance with an embodiment. In some embodiments, the process 700 is performed by the DAC calibration system 200. In other embodiments, the process 700 is performed by other entities. In some embodiments, the process 700 includes more, fewer, or different steps than shown in FIG. 7.

At step 705, the DAC calibration system 200 designates a DAC unit cell of a number of DAC unit cells as the reference cell. As mentioned above, a reference cell may be defined as the DAC unit cell which is used as a reference to calibrate other cells within the DAC. In some embodiments, the reference cell may be designated arbitrarily with any DAC unit cell having an equal chance of being designated as the reference cell. At step 710, the DAC calibration system 200 determines which DAC unit cell of the number of DAC unit cells has the lowest amplitude of the output signal excluding the reference cell. The DAC calibration system 200 may determine which DAC unit cell has the lowest amplitude by measuring the amplitude of the output signals of each of the DAC unit cells by the detector 220 and comparing the amplitudes to determine the lowest one. At step 715, the DAC calibration system 200 compares the amplitude of the lowest amplitude DAC unit cell determined at step 710 to the reference cell designated at step 705. If the amplitude of the reference cell designated at step 705 is higher than the DAC unit cell determined to have the lowest amplitude, the DAC calibration system 200 calibrates (e.g., changes, modifies, updates, etc.) the reference cell to match the amplitude of the lowest amplitude DAC unit cell at step 720. In some embodiments, the reference DAC unit cell is chosen and each remaining cell is compared to the reference cell. If the reference cell is has a higher amplitude output, then the reference cell is adjusted to have the output of that cell. The adjusted reference cell is compared to the remaining cells in this fashion to ensure that the reference cell has the lowest amplitude. At step 725, the DAC calibration system 200 calibrates the remainder of the number of DAC unit cells to match the amplitude of the reference cell. In some embodiments, the highest value instead of the lowest value can be utilized.

Figure 8:
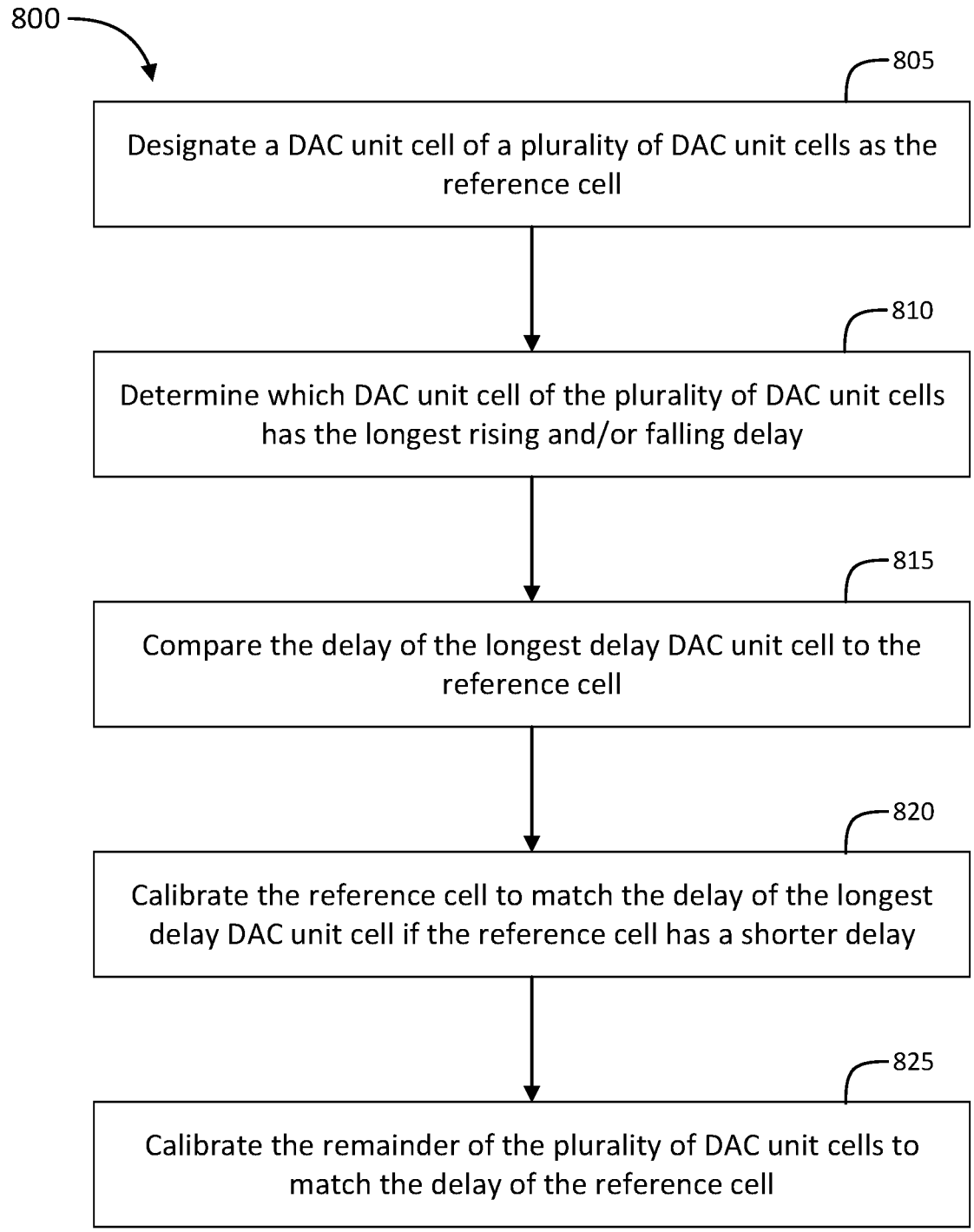
FIG. 8 a flow diagram showing operations for calibrating the delay of one or more DAC unit cells, in accordance with an embodiment.

FIG. 8 is a flow chart depicting a process 800 for calibrating the delay of one or more DAC unit cells. In some embodiments, the process 800 is performed by the DAC calibration system 200. In other embodiments, the process 800 is performed by other entities. In some embodiments, the process 800 includes more, fewer, or different steps than shown in FIG. 8.

At step 805, the DAC calibration system 200 designates a DAC unit cell of a plurality of DAC unit cells as the reference cell. As mentioned above, a reference cell may be defined as the DAC unit cell which is used as a reference to calibrate other cells within the DAC. In some embodiments, the reference cell may be designated arbitrarily with any DAC unit cell having an equal chance of being designated as the reference cell. At step 810, the DAC calibration system 200 determines which DAC unit cell of the number of DAC unit cells has the longest rising and/or falling delay excluding the reference cell. At step 815, the DAC calibration system 200 compares delay of the longest delay DAC unit cell determined at step 810 to the reference cell designated at step 805. In some embodiments, the reference DAC unit cell is chosen and each remaining cell is compared to the reference cell. If the reference cell is has a shorter delay, then the reference cell is adjusted to have the delay of that cell. The adjusted reference cell is compared to the remaining cells in this fashion to ensure that the reference cell has the slowest timing. At step 820, the DAC calibration system 200 calibrates the reference cell to match the delay of the longest delay DAC unit cell if the reference cell has a shorter delay. At step 825, the DAC calibration system 200 calibrates the remainder of the plurality of DAC unit cells to match the delay of the reference cell. In some embodiments, the reference cell has the fastest timing instead of the slowest timing. In this case, if the reference cell is has a longer delay, then the reference cell is adjusted to have the delay of that cell. The adjusted reference cell is compared to the remaining cells in this fashion to ensure that the reference cell has the fastest timing. At step 820, the DAC calibration system 200 calibrates the reference cell to match the delay of the shortest delay DAC unit cell if the reference cell has a shorter delay. At step 825, the DAC calibration system 200 calibrates the remainder of the plurality of DAC unit cells to match the delay of the reference cell.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C #, or in any byte code language such as JAVA. The software programs or executable instructions can be stored on or in one or more articles of manufacture as object code. In some embodiments, the DAC is employed as an integrated circuit in a transmitter for wireless communication. The DAC is provided on an integrated circuit that includes the calibration engine. The DAC and calibration engine are provided in a single chip or multichip integrated package in some embodiments.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A digital-to-analog converter (DAC), comprising:
    a plurality of unit cells configured to receive a digital input from a processing circuit and convert the digital input to analog outputs,
    an engine configured to:
    designate one of the plurality of unit cells as a reference cell with a first value; and
    calibrate the first value using a value of the unit cells, wherein the value is a delay value,
    wherein the digital input is provided to a first unit cell and has an opposite sign to the digital input provided to the reference cell.

2. The DAC of claim 1, wherein the engine is configured to calibrate the remainder of the plurality of unit cells to match the first value.

3. The DAC of claim 1, wherein analog outputs are combined to create an overall analog output by summing a second analog output at least from a first analog output, wherein the overall analog output comprises a combination of analog outputs from the plurality of unit cells.

4. The DAC of claim 1, wherein the first value and the lowest or highest value is at least one of an amplitude of the analog outputs and a timing of the analog outputs.

5. The DAC of claim 1, wherein the DAC is part of a transmitter for wireless communication.

6. A method for calibrating a digital-to-analog converter (DAC), the method comprising:
    designating one of a plurality of DAC unit cells as a reference cell;
    adjusting the reference cell to have a first value for an output signal at a first output;
    comparing output signals at the outputs of remaining DAC unit cells of the plurality of DAC unit cells with the first output; and
    adjusting the remaining DAC unit cells of the plurality of DAC unit cells in accordance with the first value.

7. The method of claim 6, wherein the comparing uses a first digital input at one of the remaining DAC unit cells, wherein the first digital input is at least one of a current signal and a voltage signal.

8. The method of claim 6, wherein the first value is a lowest or highest value of amplitude of the output signals at the outputs.

9. The method of claim 6, wherein the first value is a lowest or highest value of amplitude or speed of the output signals at the outputs.

10. The method of claim 9, wherein the lowest value of speed is a longest delay or the highest value of speed is the shortest delay.

11. The method of claim 6, wherein the DAC is a transmitter for wireless communication.

12. The method of claim 6, wherein adjusting provides a change to a drive strength.

13. A calibration system for a digital-to-analog converter (DAC), the DAC being configured to receive, by a plurality of DAC unit cells, a digital input and convert the digital input to analog signals, the analog signals being summed as an output signal, the calibration system, comprising:
    a detector configured to determine a difference between a first value of a first cell of the DAC unit cells to a reference value of a reference cell at a summed output associated with the output signal; and a calibration engine configured to adjust the first cell to have the first value match the reference value in response to an error.

14. The calibration system of claim 13, wherein the digital input is at least one of a current signal and a voltage signal and wherein the reference value is a lowest or highest value in amplitude or speed provided by the plurality of DAC unit cells.

15. The calibration system of claim 13, wherein the reference cell and the first cell receive opposite digital inputs.

16. The calibration system of claim 13, wherein the detector and the calibration engine are used to adjust the remaining cells of the plurality of DAC unit cells.

17. The calibration system of claim 13, wherein the DAC is a transmitter for wireless communication and is provided on an integrated circuit including the calibration engine.

18. The calibration system of claim 13, wherein the reference cell is one of the plurality of DAC unit cells.

19. A digital-to-analog converter (DAC), comprising:
a plurality of unit cells configured to receive a digital input from a processing circuit and convert the digital input to analog outputs;
an engine configured to:
designate one of the plurality of unit cells as a reference cell with a first value;
calibrate the first value using a lowest or highest value of the unit cells; and
wherein the digital input is provided to a first unit cell and has an opposite sign to the digital input provided to the reference cell.

20. The DAC of claim 19, wherein the lowest value is a delay value.

* * * * *